United States Patent
Chang et al.

(10) Patent No.: US 8,399,969 B2
(45) Date of Patent: Mar. 19, 2013

(54) CHIP PACKAGE AND FABRICATING METHOD THEREOF

(75) Inventors: Kuo-Ching Chang, Hsinchu (TW);
Wu-Cheng Kuo, Hsinchu (TW);
Tzu-Han Lin, Hsinchu (TW)

(73) Assignee: VisEra Technologies Company Limited, Hsinchu Science Park (TW)

( * ) Notice: Subject to any disclaimer, the term of this patent is extended or adjusted under 35 U.S.C. 154(b) by 273 days.

(21) Appl. No.: 12/844,590

(22) Filed: Jul. 27, 2010

(65) Prior Publication Data
US 2012/0025387 A1 Feb. 2, 2012

(51) Int. Cl.
*H01L 23/495* (2006.01)
*H01L 21/00* (2006.01)
(52) U.S. Cl. ........... 257/676; 257/773; 438/123
(58) Field of Classification Search .......... 257/676, 257/773; 438/123
See application file for complete search history.

(56) References Cited

U.S. PATENT DOCUMENTS

| | | | | |
|---|---|---|---|---|
| 6,433,394 B1 * | 8/2002 | Intrater | | 257/355 |
| 7,732,301 B1 * | 6/2010 | Pinnington et al. | | 438/455 |
| 2002/0123163 A1 * | 9/2002 | Fujii | | 438/26 |
| 2003/0089522 A1 * | 5/2003 | Dances | | 174/260 |
| 2006/0061974 A1 * | 3/2006 | Soga et al. | | 361/743 |
| 2009/0050907 A1 * | 2/2009 | Yuan et al. | | 257/88 |

FOREIGN PATENT DOCUMENTS

CN 1366715 8/2002

* cited by examiner

*Primary Examiner* — Long Tran
(74) *Attorney, Agent, or Firm* — Muncy, Geissler, Olds and Lowe, PLLC

(57) ABSTRACT

A chip package and a fabrication method thereof are provided. The chip package includes a substrate and a chip disposed over the substrate. A solder layer is disposed between the chip and the substrate. A conductive pad is disposed between the solder layer and the substrate, wherein the conductive pad includes a first portion disposed under the solder layer, a second portion disposed away from the first portion and a connective portion disposed between the first portion and the second portion. The connective portion has a width which is narrower than a width of the first portion along a first direction perpendicular to a second direction extending from the first portion to the connective portion.

19 Claims, 9 Drawing Sheets

CHIP PACKAGE AND FABRICATING METHOD THEREOF

BACKGROUND OF THE INVENTION

1. Field of the Invention

The invention relates to a chip package and more particularly to a conductive pad design of a chip package which prevents solder overflow.

2. Description of the Related Art

In conventional chip packages, a chip, for example a light emitting chip, is soldered on a metal pad through a solder layer by a solder reflow process. The metal pad has a portion covered with the solder layer for soldering with the chip and a portion not covered with the solder layer and the chip. The solder layer is disposed on the portion of the metal pad covered with the chip before the solder reflow process. However, after the solder reflow process, the solder layer overflows from the portion of the metal pad covered with the chip onto the portion not covered with the chip. In such a case, the solder layer between the chip and the metal pad may be insufficient for soldering the chip on the metal pad. Thus, reliability of the conventional chip package is reduced due to solder overflow.

Therefore, a chip package capable of overcoming the above problems is desired.

BRIEF SUMMARY OF THE INVENTION

A chip package is provided, wherein solder overflow is prevented through structural design of a conductive pad. Thus, enhancing reliability of chip packages.

An exemplary embodiment of the chip package comprises a substrate and a chip disposed over the substrate. A solder layer is disposed between the chip and the substrate. A conductive pad is disposed between the solder layer and the substrate, wherein the conductive pad comprises a first portion disposed under the solder layer, a second portion disposed away from the first portion and a connective portion disposed between the first portion and the second portion, and wherein the connective portion has a width which is narrower than a width of the first portion along a first direction perpendicular to a second direction extending from the first portion to the connective portion.

In an exemplary embodiment, a method for fabricating a chip package is provided. The method comprises forming a conductive pad on a substrate. A solder layer is formed on the conductive pad and a chip is provided on the solder layer. The conductive pad comprises a first portion disposed under the solder layer, a second portion disposed away from the first portion, a third portion disposed away from the first portion and opposite to the second portion, and a connective portion disposed between the first portion and the second portion, wherein the connective portion has a width which is narrower than a width of the first portion along a first direction perpendicular to a second direction extending from the first portion to the connective portion.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
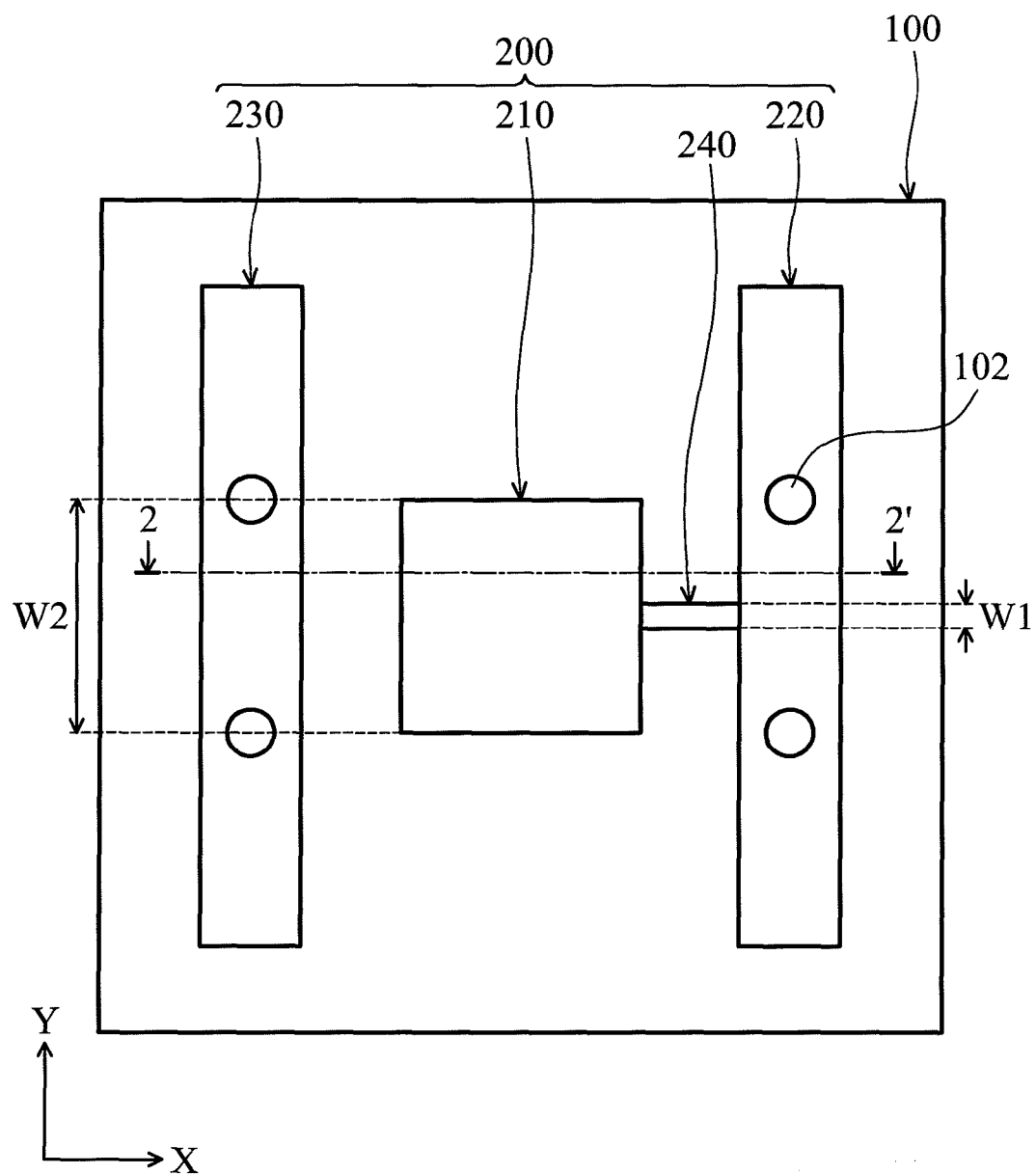
FIGS. 1A-1D show schematic plane views of a conductive pad for a chip package according to various embodiments of the invention.

An exemplary embodiment of the invention provides a conductive pad design for a chip package to prevent solder overflow. FIG. 1A shows a plane view of a conductive pad 200 for a chip package according to an embodiment of the invention. The conductive pad 200 is disposed on a substrate 100, having a first portion 210 disposed under a solder layer (not shown), a second portion 220 disposed away from the first portion 210, a third portion 230 disposed away from the first portion 210 and opposite to the second portion 220, and a connective portion 240 disposed between the first portion 210 and the second portion 220. The connective portion 240 has a width W1 narrower than a width W2 of the first portion 210 along a first direction Y perpendicular to a second direction X extending from the first portion 210 to the connective portion 240. In an embodiment, the width W1 of the connective portion 240 may be between about 100 μm and about 200 μm, and the width W2 of the first portion 210 may be between about 1000 μm and about 2000 μm. A ratio of the width W1 of the connective portion 240 to the width W2 of the first portion 210 may be between about 1:10 and about 1:20

Figure 2:
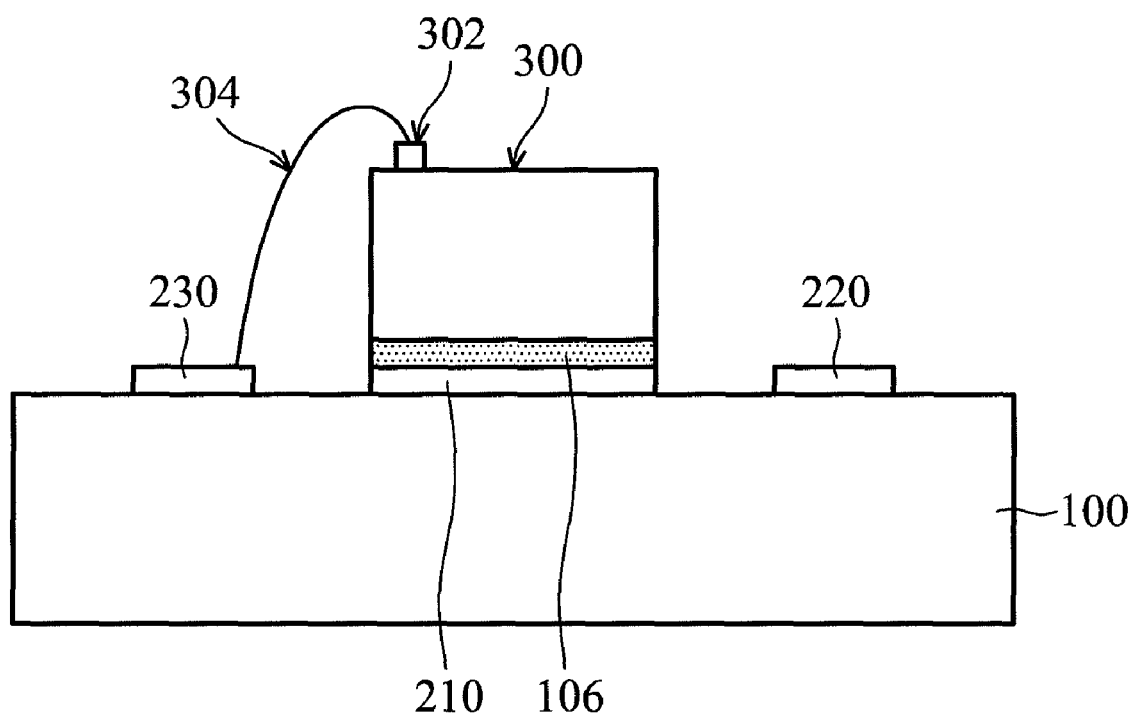
FIG. 2 is a schematic cross section of a chip package along a dotted line 2-2' of FIG. 1A according to an embodiment of the invention.

Then, referring to FIG. 2, a cross section of a chip package along a dotted line 2-2' of FIG. 1A according to an embodiment of the invention is shown. The first portion 210, the second portion 220, the third portion 230 and the connective portion 240 (not shown) of the conductive pad 200 are formed on the substrate 100. The substrate 100 may be a semiconductor substrate, a ceramic substrate or a metal printed circuit board (MPCB). The conductive pad 200 may be formed from metal, such as TiW, Cu, Ni or the combinations thereof. A solder layer 106 is disposed on the first portion 210 of the conductive pad for soldering a chip 300 to the first portion 210 of the conductive pad. In an embodiment, the solder layer 106 may be formed from Sn—Cu alloy. It is easy for the solder layer 106 to overflow onto a metal pad during a solder reflow process. However, in the embodiments of the invention, the width W1 of the connective portion 240 is narrower than the width W2 of the first portion 210, such that it is difficult for the solder layer 106 to overflow onto the connective portion 240 during the solder reflow process. Thus, after the solder reflow process, the solder layer 106 is contained in the first portion 210 and does not overflow onto the connective portion 240 and the second portion 220. The narrow connective portion 240 efficiently prevents the solder layer 106 from overflowing.

As shown in FIG. 2, the chip 300 is provided over the solder layer 106. After the solder reflow process, the chip 300 is soldered on the first portion 210 of the conductive pad through the solder layer 106. The chip 300 may be a semiconductor chip having integrated circuits formed thereon. In an embodiment, the chip 300 may be a light-emitting diode (LED) chip or a Zener diode chip, which has an upper contact electrode 302 formed on one side of the chip 300 and electrically connected to the third portion 230 of the conductive pad through a conductive wire 304. A lower contact electrode (not shown) is formed opposite to the upper contact electrode 302 and is disposed on the bottom of the chip 300. The lower contact electrode of the chip 300 is electrically connected to the second portion 220 of the conductive pad through the solder layer 106, the first portion 210 and the connective portion 240 of the conductive pad.

In an embodiment, a metal layer (not shown) may be formed between the solder layer 106 and the first portion 210 of the conductive pad. The metal layer may be formed from Cu, Ni, Au or Ag, and the solder layer 106 may be formed from Sn—Cu alloy. Thus, the chip 300 can be bonded on the substrate 100 through eutectic bonding between the solder layer 106 and the metal layer to enhance bonding strength in the interface between the metal layer and the Sn—Cu alloy solder layer 106.

In embodiments of the invention, the chip 300 may be an LED chip or a Zener diode chip formed on a silicon substrate, a sapphire substrate or a metal substrate, such as a Cu substrate. An additional metal layer (not shown) may be disposed between the substrate of the chip 300 and the solder layer 106. The additional metal layer may be formed from Cu, Ni, Au or Ag. The additional metal layer can increase the ohmic contact of the LED chip 300. Moreover, a higher bonding strength can be obtained in the interface between the additional metal layer and the Sn—Cu alloy solder layer 106.

Referring to FIG. 2, in this embodiment, the chip 300 and the first portion 210, the second portion 220, the third portion 230 and the connective portion 240 (not shown) of the conductive pad 200 are disposed on the substrate 100. In another embodiment, a cavity (not shown) may be formed in the substrate 100 and the chip 300 and the first portion 210, the second portion 220, the third portion 230 and the connective portion 240 of the conductive pad 200 can be disposed in the cavity of the substrate 100.

Then, referring to FIG. 1A again, the second portion 210 and the third portion 230 of the conductive pad may have one or more than one through vias 102 formed thereon, respectively. The through vias 102 pass through the second portion 210 and the third portion 230 of the conductive pad, respectively, and further pass through the substrate 100 to form electrical connections between the chip 300 and an external circuit (not shown).

Figure 1B:
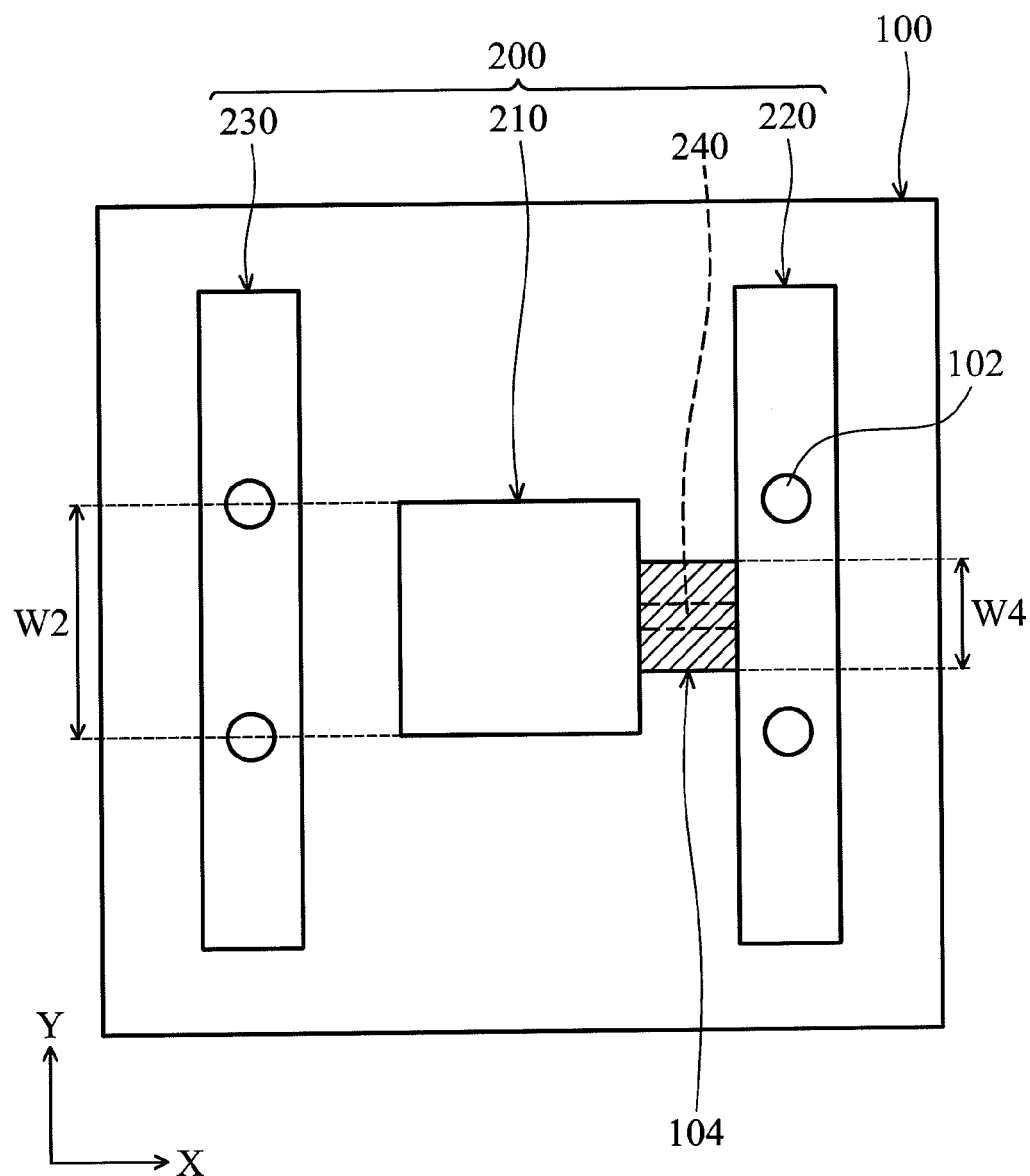

Next, referring to FIG. 1B, a plane view of a conductive pad 200 for a chip package according to an embodiment of the invention is shown. The difference between FIG. 1A and FIG. 1B is that a blocking film 104 is formed covering the connective portion 240 of the conductive pad and disposed between the first portion 210 and the second portion 220 of the conductive pad. The blocking film 104 can further constrain the overflow issue of the solder layer 106 during the solder reflow process. The blocking film 104 may be formed from an organic or an inorganic insulating material, wherein an inorganic insulating material is preferred. The organic insulating material of the blocking film 104 may be a dry film type photoresist. The dry film type photoresist is a photosensitizing material used in photolithography to form precision patterns and provides excellent conformity that allows lamination for a multilayer configuration with the desired thickness. The inorganic insulating material of the blocking film 104 may be silicon oxides, silicon nitrides, silicon oxynitrides or combinations thereof. In an embodiment, the blocking film 104 has a thickness of about 3 μm to about 50 μm and a width W4 of the blocking film 104 is smaller than or equal to the width W2 of the first portion 210 of the conductive pad along the direction Y.

Figure 1C:
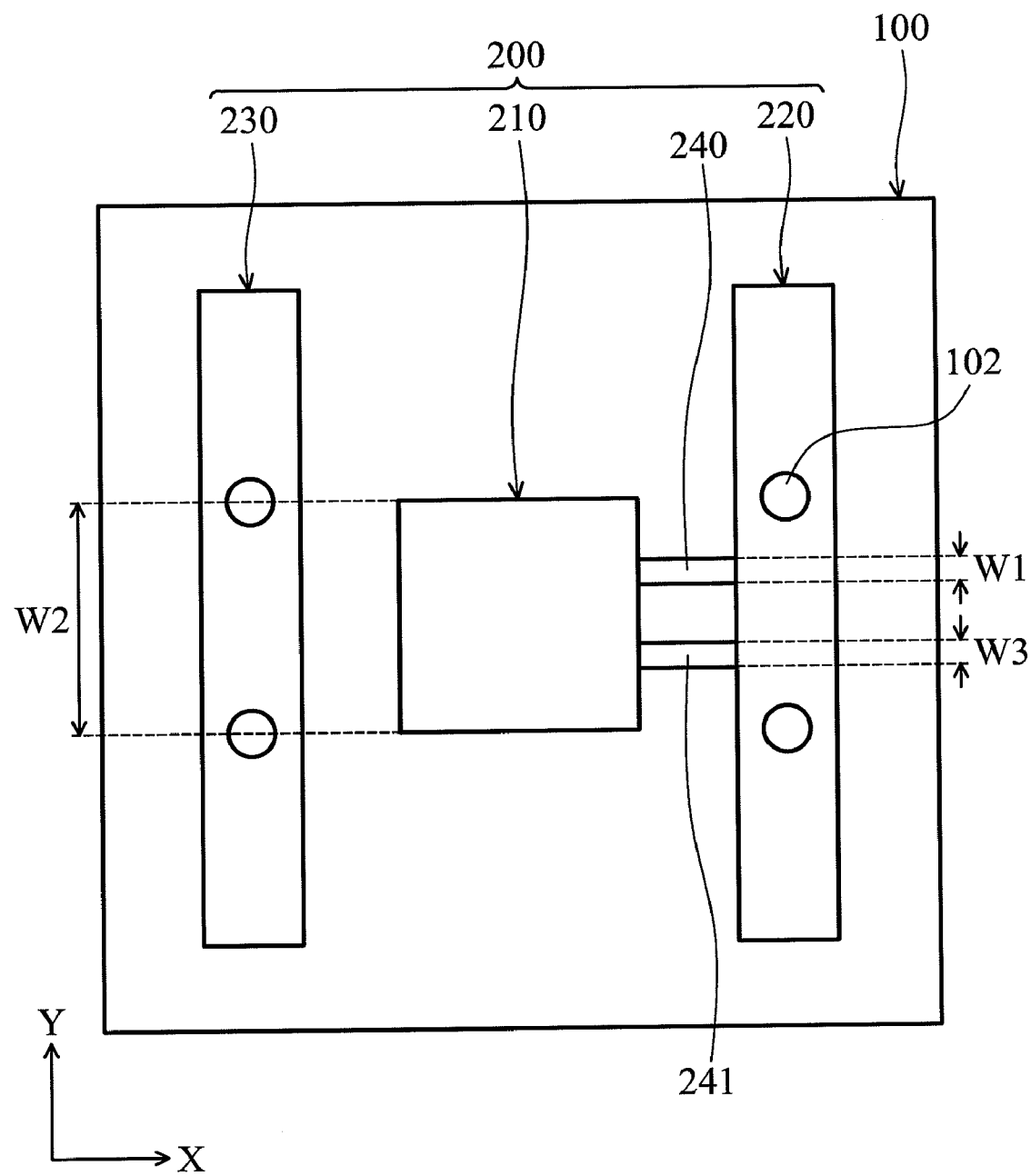

FIG. 1C shows a plane view of a conductive pad 200 for a chip package according to an embodiment of the invention. The difference between FIG. 1A and FIG. 1C is that two connective portions 240 and 241 are disposed between the first portion 210 and the second portion 220 of the conductive pad. Although there are only two connective portions 240 and 241 shown in FIG. 1C, more than two connective portions can be disposed between the first portion 210 and the second portion 220 of the conductive pad in other embodiments. The first connective portion 240 has a width W1 and the second connective portion 241 has a width W3, wherein the width W1 may be the same as or different to the width W3. In an embodiment, the width W1 and the width W3 may be between about 100 μm and about 200 μm.

Figure 1D:
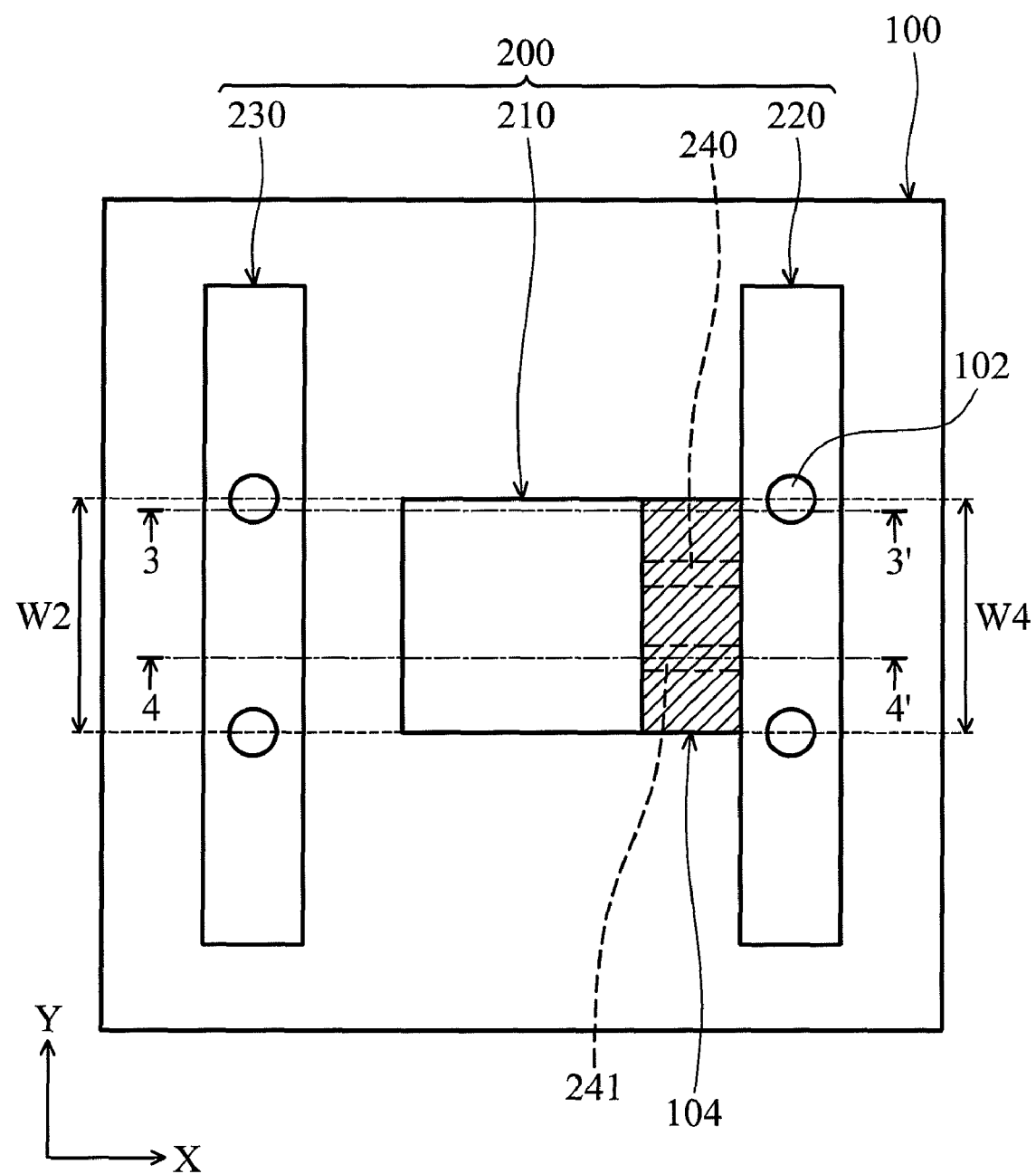

Next, referring to FIG. 1D, a plane view of a conductive pad 200 for a chip package according to an embodiment of the invention is shown. The difference between FIG. 1C and FIG. 1D is that a blocking film 104 is formed covering the connective portions 240 and 241 and disposed between the first portion 210 and the second portion 220 of the conductive pad 200. The blocking film 104 inhibit overflow of the solder layer 106 during the solder reflow process. The blocking film 104 may be formed from an organic or an inorganic insulating material, wherein an inorganic insulating material is preferred. The organic insulating material of the blocking film 104 may be a dry film type photoresist. The inorganic insulating material of the blocking film 104 may be silicon oxides, silicon nitrides, silicon oxynitrides or combinations thereof. In an embodiment, the blocking film 104 has a thickness of about 3 μm to about 50 μm and a width W4 of the blocking film 104 is equal to or smaller than the width W2 of the first portion 210 of the conductive pad along the direction Y.

Figure 3:
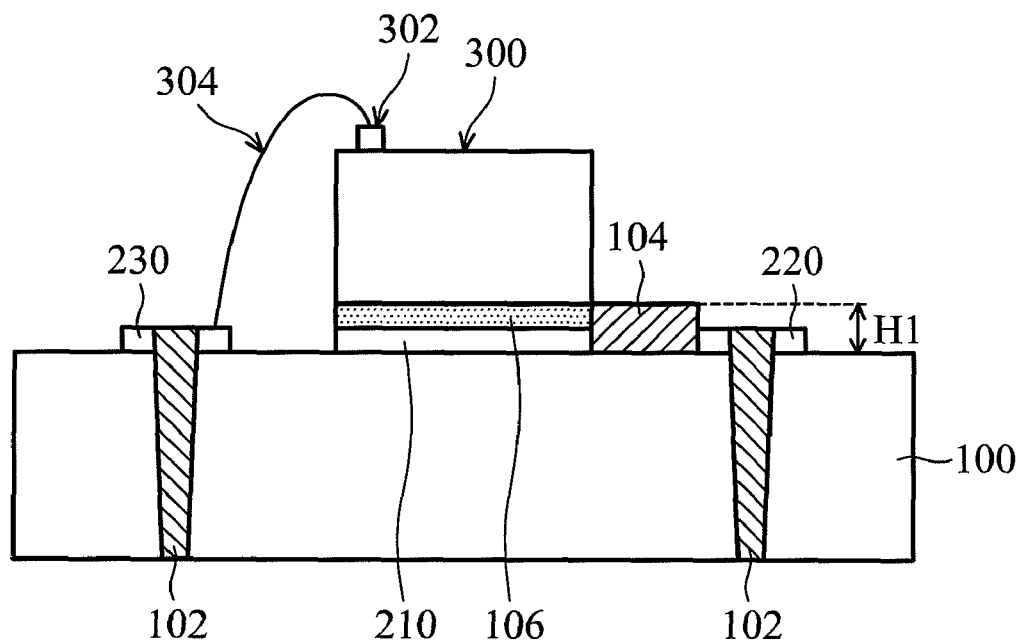
FIG. 3 is a schematic cross section of a chip package along a dotted line 3-3' of FIG. 1D according to an embodiment of the invention.

Then, referring to FIG. 3, a cross section of a chip package along a dotted line 3-3' of FIG. 1D according to an embodiment of the invention is shown. As shown in FIG. 3, the blocking film 104 is disposed between the first portion 210 and the second portion 220 of the conductive pad. Along a dotted line 3-3' of FIG. 1D, there is no connective portion disposed under the blocking film 104. In an embodiment, the blocking film 104 is substantially level with the solder layer 106 to inhibit overflow of the solder layer 106 during the solder reflow process. The blocking film 104 has a thickness H1 of about 3 μm to about 50 μm along the dotted line 3-3' of FIG. 1D.

Figure 4:
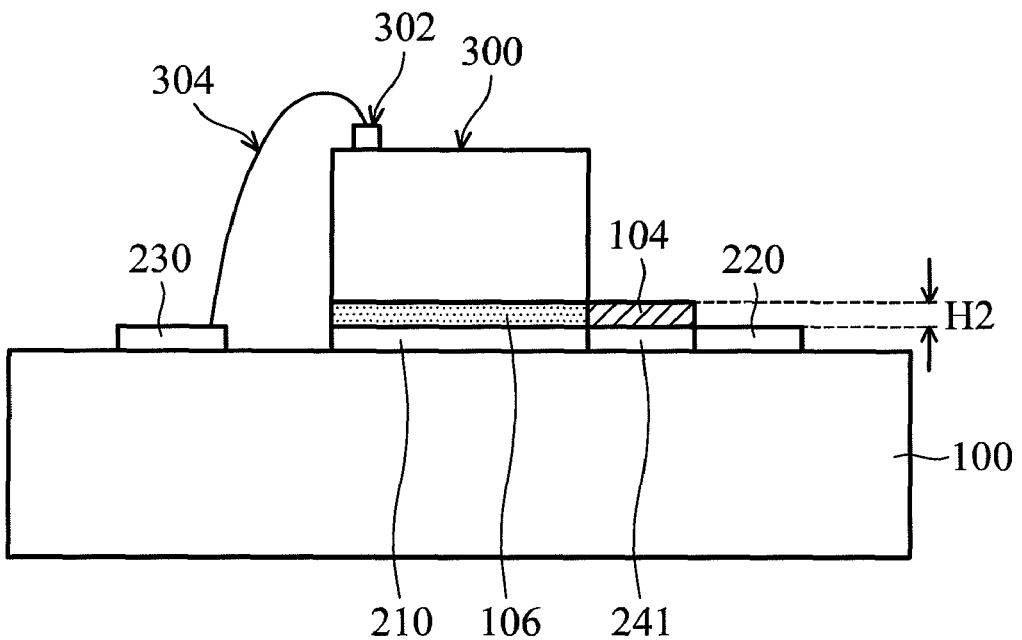
FIG. 4 is a schematic cross section of a chip package along a dotted line 4-4' of FIG. 1D according to an embodiment of the invention.

Referring to FIG. 4, a cross section of a chip package along a dotted line 4-4' of FIG. 1D according to an embodiment of the invention is shown. As shown in FIG. 4, the blocking film 104 is disposed over the second connective portion 241 and between the first portion 210 and the second portion 220 of the conductive pad. In an embodiment, the blocking film 104 is substantially level with the solder layer 106 to constrain the overflow of the solder layer 106 during the solder reflow process. The blocking film 104 on the second connective portion 241 of the conductive pad has a thickness H2 of about 3 μm to about 50 μm along the dotted line 4-4' of FIG. 1D.

It is easy for the solder layer 106 to overflow onto a metal pad during a solder reflow process. However, according to the embodiments of the invention, the connective portions 240 and 241 and/or the blocking film 104 can effectively hinder overflow of the solder layer 106 during the solder reflow process.

Figure 5A:
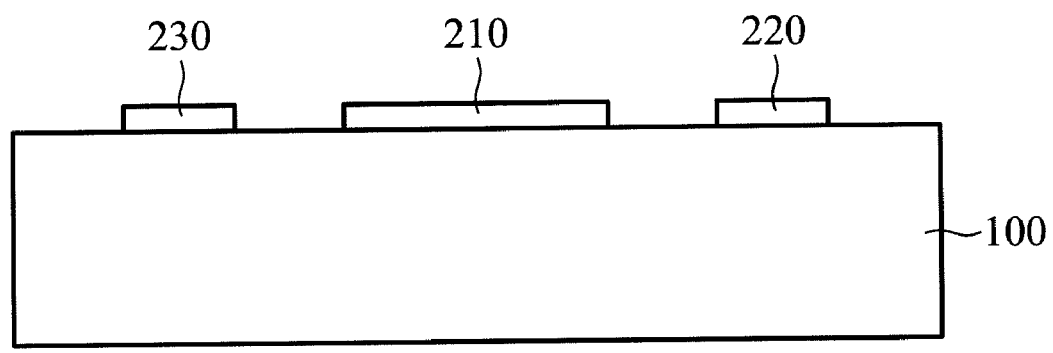
FIGS. 5A-5E show cross sections of several stages of fabricating a chip package according to an embodiment of the invention.

FIGS. 5A-5E show cross sections of fabricating a chip package of FIG. 3 along a dotted line 3-3' of FIG. 1D according to an embodiment of the invention. Referring to FIG. 5A, the substrate 100 is provided, such as a silicon substrate. Then, a metal layer (not shown) is formed, by a sputtering process, a physical vapor deposition (PVD) method or other deposition methods, on the substrate 100. The metal layer may be formed from TiW, Cu and Ni layers in sequence. In an embodiment, before forming the metal layer, a cavity (not shown) may be formed in the substrate 100 by a photolithography and etching process, and then the metal layer is formed in the cavity of the substrate 100. Next, the metal layer is patterned to form the first portion 210, the second portion 220, the third portion 230 and the connective portions 240 and 241 (not shown in FIGS. 5A-5E) of the conductive pad 200 by a photolithography and etching process.

Figure 5B:
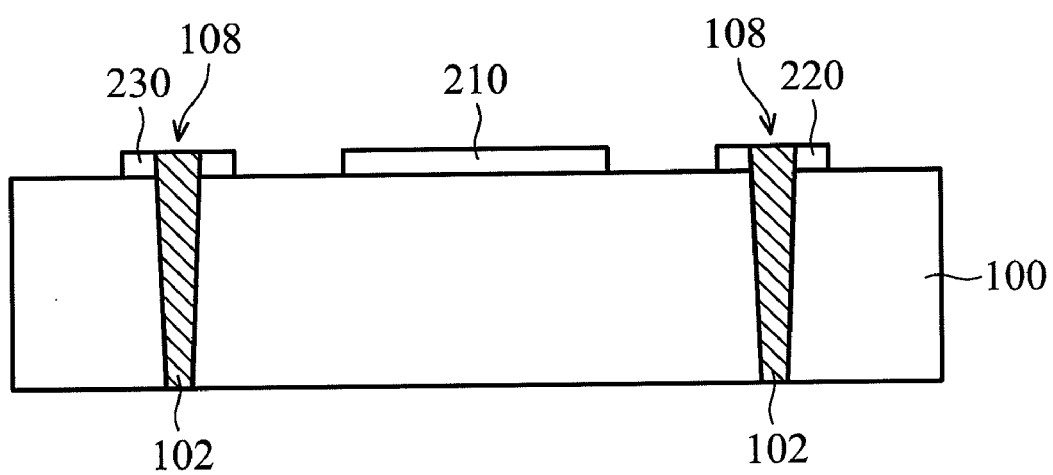

Referring to FIG. 5B, through holes 108 are formed passing through the second portion 220 and the third portion 230 of the conductive pad, respectively, and further passing through the substrate 100. Then, the through holes 108 are filled with a conductive material to form the through vias 102.

Figure 5C:
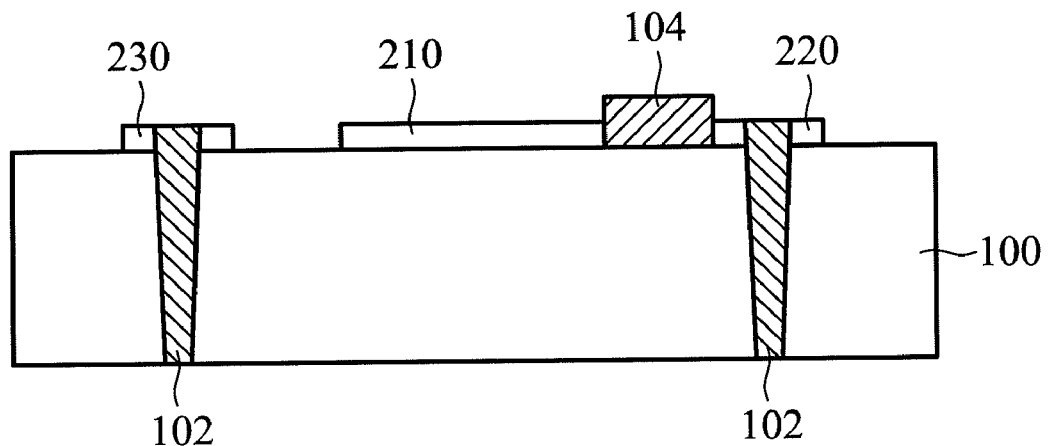

Next, referring to FIG. 5C, the blocking film 104 is formed between the first portion 210 and the second portion 220 of the conductive pad and covering the connective portions 240 and 241 of the conductive pad. In an embodiment, the blocking film 104 may be formed from an organic insulating material, such as a dry film type photoresist, which can be formed by a photolithography process or a printing process. In another embodiment, the blocking film 104 may be formed from an inorganic insulating material, such as silicon oxides, silicon nitrides or silicon oxynitrides, which can be deposited by a chemical vapor deposition (CVD) method, a thermal oxidation process or other deposition methods, and then patterned by a photolithography and etching process. In an embodiment, the blocking film 104 made of the inorganic insulating material can be formed by a printing process.

Figure 5D:
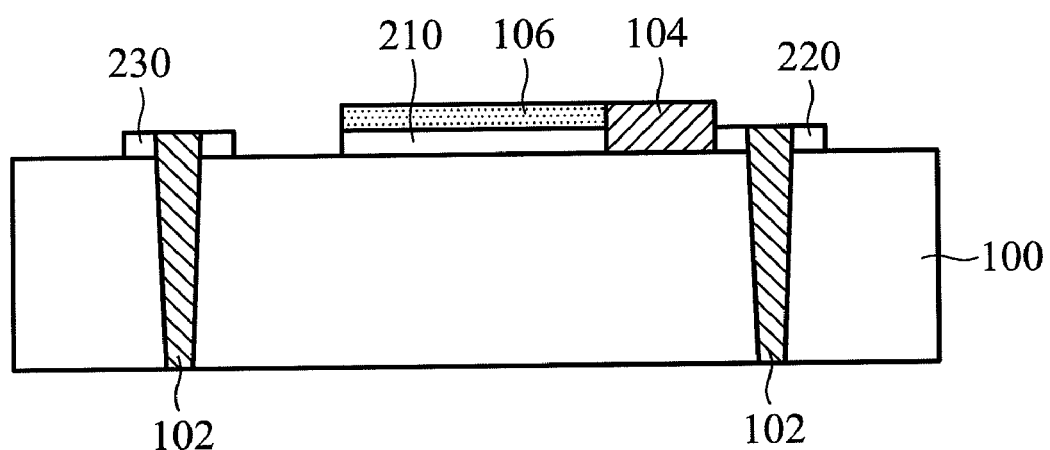

Referring to FIG. 5D, the solder layer 106 is formed on the first portion 210 of the conductive pad by a sputtering method, an e-gun evaporation method or a stencil printing method. In an embodiment, the solder layer 106 may be formed from Sn—Cu alloy. From a top view, the solder layer 106 has a size that is substantially the same as a size of the first portion 210 of the conductive pad and that of an LED chip which is subsequently formed on the solder layer 106. Meanwhile, the positions of the solder layer 106 and the first portion 210 of the conductive pad are the same as that of the chip 300.

Figure 5E:
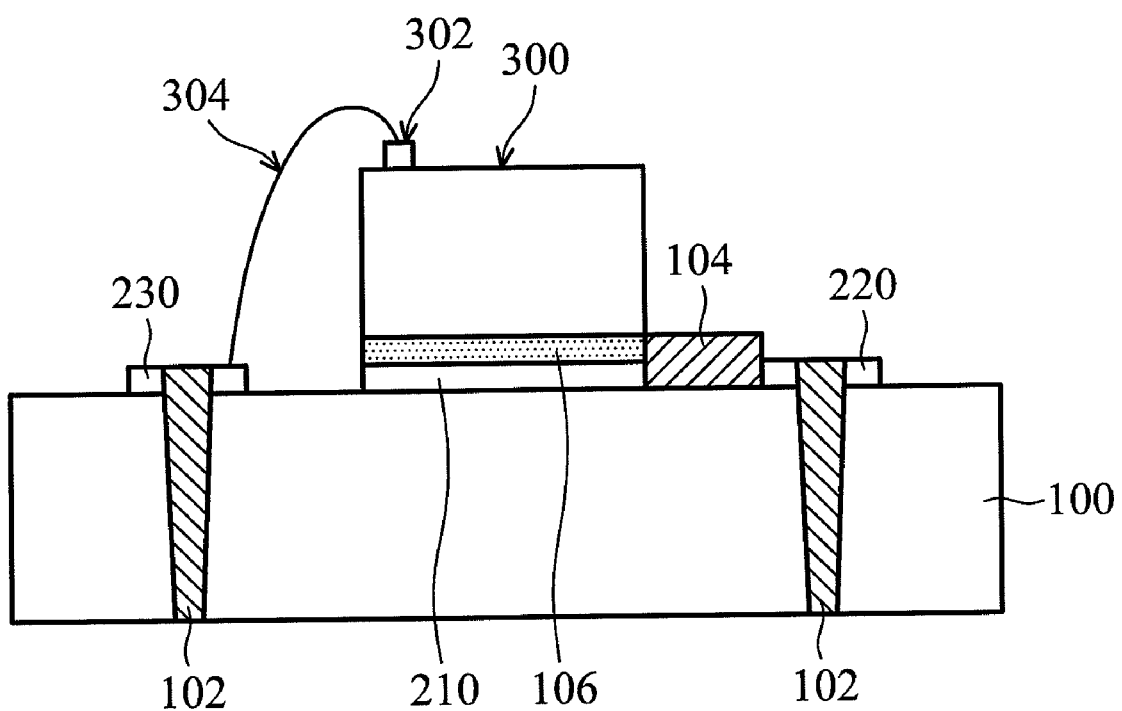

Next, referring to FIG. 5E, the chip 300 such as an LED chip is disposed on the solder layer 106. In an embodiment, the LED chip 300 may be a vertical typed LED chip, having a lower contact electrode (not shown) on a bottom surface of the LED chip 300 and an upper contact electrode 302 on a top surface of the LED chip 300. The upper contact electrode 302 may be a p-type contact electrode or an n-type contact electrode, which has opposite conductivity to the lower contact electrode. Next, the conductive wire 304 is formed to electrically connect the upper contact electrode 302 of the LED chip 300 to the third portion 230 of the conductive pad. Thus, the upper contact electrode 302 of the LED chip 300 is electrically connected to the through via 102 through the conductive wire 304 and the third portion 230 of the conductive pad, and further electrically connected to an external circuit through the through via 102. Meanwhile, the lower contact electrode of the LED chip 300 is electrically connected to the through via 102 through the solder layer 106, the first portion 210, the connective portions 240 and 241, and the second portion 220 of the conductive pad, and further electrically connected to an external circuit through the through via 102.

Then, the LED chip 300 is soldered on the first portion 210 of the conductive pad to bond with the substrate 100 through the solder layer 106 by a solder reflow process. Note that in embodiments of the invention, the widths of the connective portions 240 and 241 are narrower than that of the first portion 210 of the conductive pad, such that overflowing of the solder layer 106 during the solder reflow process is hindered. Moreover, the blocking film 104 may be disposed over the connective portions 240 and 241 and between the first portion 210 and the second portion 220 of the conductive pad, such that overflowing of the solder layer 106 during the solder reflow process is further constrained.

According to the aforementioned embodiments, a chip package is provided, wherein solder overflow is prevented through structural design of a conductive pad. Thus, enhancing reliability of chip packages. Moreover, the chip packages of the invention can be applied to substrates having through vias therein, such that the size of the chip package may be reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
a solder layer disposed between a chip and a substrate; and
a conductive pad disposed between the solder layer and the substrate, wherein the conductive pad comprises a first portion disposed under the solder layer, a second portion disposed away from the first portion, a connective portion and an additional connective portion disposed between the first portion and the second portion, and wherein the connective portion has a width which is narrower than a width of the first portion along a first direction perpendicular to a second direction extending from the first portion to the connective portion, and the additional connective portion has a width which is narrower than the width of the first portion along the first direction.

2. The chip package as claimed in claim 1, wherein the width of the connective portion is between 100μm and 200μm.

3. The chip package as claimed in claim 1, further comprising a blocking film covering the connective portion and disposed between the first portion and the second portion.

4. The chip package as claimed in claim 3, wherein the blocking film has a thickness of 3μm to 50μm.

5. The chip package as claimed in claim 3, wherein the material of the blocking film comprises silicon oxides, silicon nitrides, silicon oxynitrides or a dry film type photoresist.

6. The chip package as claimed in claim 1, wherein the width of the additional connective portion is between 100μm and 200μm.

7. The chip package as claimed in claim 1, further comprising a blocking film covering the connective portion and the additional connective portion, and disposed between the first portion and the second portion.

8. The chip package as claimed in claim 1, wherein the chip comprises a light-emitting diode chip or a Zener diode chip.

9. The chip package as claimed in claim 8, wherein the conductive pad further comprises a third portion disposed away from the first portion and opposite to the second portion.

10. The chip package as claimed in claim 9, wherein the chip has a lower contact electrode and an upper contact electrode electrically connected to the second portion and the third portion, respectively.

11. A method for fabricating a chip package, comprising:
forming a conductive pad on a substrate;
forming a solder layer on the conductive pad; and
providing a chip on the solder layer,
wherein the conductive pad comprises a first portion disposed under the solder layer, a second portion disposed away from the first portion, a third portion disposed away from the first portion and opposite to the second portion, a connective portion and an additional connective portion disposed between the first portion and the second portion, and wherein the connective portion has a width which is narrower than a width of the first portion along a first direction perpendicular to a second direction extending from the first portion to the connective portion, and the additional connective portion has a width which is narrower than the width of the first portion along the first direction.

12. The method as claimed in claim 11, further comprising performing a solder reflow process to solder the chip on the substrate.

13. The method as claimed in claim 12, wherein the solder layer remains on the first portion after the solder reflow process.

14. The method as claimed in claim 11, further comprising forming a blocking film to cover the connective portion, wherein the blocking film is formed between the first portion and the second portion.

15. The method as claimed in claim 14, wherein the material of the blocking film comprises silicon oxides, silicon nitrides, silicon oxynitrides or a dry film type photoresist.

16. The method as claimed in claim 15, wherein the step of forming the blocking film comprises a photolithography and etching process or a printing process.

17. The method as claimed in claim 11, wherein the chip comprises a light-emitting diode chip or a Zener diode chip, and the chip has a lower contact electrode and an upper contact electrode electrically connecting to the second portion and the third portion, respectively.

18. The method as claimed in claim 11, wherein the step of forming the conductive pad comprises a photolithography and etching process or a printing process.

19. The method as claimed in claim 11, wherein the width of the connective portion is between 100μm and 200μm.

* * * * *